United States Patent
Chen et al.

(10) Patent No.: US 10,038,029 B2
(45) Date of Patent: Jul. 31, 2018

(54) LIGHT-EMITTING DEVICE

(71) Applicant: EPISTAR CORPORATION, Hsinchu (TW)

(72) Inventors: Chao-Hsing Chen, Hsinchu (TW);
Schang-Jing Hon, Hsinchu (TW);
Alexander Chan Wang, Hsinchu (TW);
Li-Tian Liang, Hsinchu (TW);
Chin-Yung Fan, Hsinchu (TW);
Chien-Kai Chung, Hsinchu (TW);
Min-Hsun Hsieh, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/829,262

(22) Filed: Aug. 18, 2015

(65) Prior Publication Data
US 2015/0357371 A1    Dec. 10, 2015

Related U.S. Application Data

(63) Continuation of application No. 13/148,544, filed as application No. PCT/CN2009/074422 on Oct. 13, 2009, now Pat. No. 9,142,534.

(30) Foreign Application Priority Data

Feb. 9, 2009 (CN) .......................... 2009 1 0007059

(51) Int. Cl.
*H01L 27/15*     (2006.01)
*H01L 25/065*    (2006.01)
(Continued)

(52) U.S. Cl.
CPC .......... *H01L 27/15* (2013.01); *H01L 25/0753* (2013.01); *H01L 27/153* (2013.01);
(Continued)

(58) Field of Classification Search
CPC ..... H01L 25/0753; H01L 33/62; H01L 27/15; H01L 27/153; H01L 27/156;
(Continued)

(56) References Cited

U.S. PATENT DOCUMENTS 4,177,413 A * 12/1979 Ascoli ................. H02J 7/027
                                                         315/135
5,663,782 A * 9/1997 Saita ................... G03B 27/547
                                                          355/37

(Continued)

FOREIGN PATENT DOCUMENTS

CN      2657203 Y     11/2004
CN      1828921 A      9/2006
(Continued)

*Primary Examiner* — Johannes P Mondt
(74) *Attorney, Agent, or Firm* — Ditthavong & Steiner, P.C.

(57) ABSTRACT

A light-emitting device includes a growth substrate, a plurality of light-emitting diode units formed on the growth substrate and arranged in a closed loop, an electrode directly formed on the growth substrate, an electrical connection structure formed on the growth substrate and connecting the plurality of light-emitting diode units with the electrode, and a plurality of rectifying diodes connecting to respective nodes of the closed loop.

10 Claims, 8 Drawing Sheets

(51) Int. Cl.
   *H01L 25/075* (2006.01)
   *H01L 27/32* (2006.01)
   *H01L 33/50* (2010.01)
   *H01L 33/62* (2010.01)

(52) U.S. Cl.
   CPC ........ H01L 27/156 (2013.01); H01L 27/3211 (2013.01); H01L 33/50 (2013.01); H01L 33/62 (2013.01); *H01L 2224/48091* (2013.01); *H01L 2224/48137* (2013.01); *H01L 2224/8592* (2013.01); *H01L 2924/12032* (2013.01); *H01L 2924/30107* (2013.01)

(58) Field of Classification Search
   CPC ... H01L 2224/48091; H01L 2224/4813; H01L 2224/8592; H01L 33/50; F21K 9/20; H05B 33/12
   USPC ...... 257/88–93, E27.121, E33.062; 315/250, 315/253
   See application file for complete search history.

(56) References Cited

U.S. PATENT DOCUMENTS

| | | | |
|---|---|---|---|
| 7,221,044 B2 * | 5/2007 | Fan | H01L 27/153 257/676 |
| 7,419,839 B2 | 9/2008 | Camras et al. | |
| 7,834,370 B2 | 11/2010 | Koya et al. | |
| 8,026,675 B2 | 9/2011 | Lee et al. | |
| 2005/0274956 A1 * | 12/2005 | Bhat | H01L 27/15 257/79 |
| 2006/0158130 A1 | 7/2006 | Furukawa | |
| 2006/0163589 A1 | 7/2006 | Fan et al. | |
| 2007/0085093 A1 * | 4/2007 | Ohmae | C30B 23/04 257/89 |
| 2007/0103899 A1 | 5/2007 | Takikawa | |
| 2007/0131942 A1 * | 6/2007 | Yen | H05B 33/0803 257/79 |
| 2007/0217476 A1 | 9/2007 | Yoshikawa et al. | |
| 2008/0006837 A1 * | 1/2008 | Park | H01L 25/167 257/98 |
| 2008/0191632 A1 | 8/2008 | Lee | |
| 2008/0277675 A1 * | 11/2008 | Fjelstad | H05K 3/32 257/88 |
| 2009/0294780 A1 * | 12/2009 | Chou | H05B 33/12 257/88 |
| 2009/0322241 A1 * | 12/2009 | Onushkin | H01L 27/156 315/250 |
| 2010/0109558 A1 | 5/2010 | Chew | |
| 2010/0224904 A1 * | 9/2010 | Lee | F21K 9/00 257/99 |
| 2016/0064625 A1 | 3/2016 | Lee et al. | |

FOREIGN PATENT DOCUMENTS

| | | | | |
|---|---|---|---|---|
| CN | 1983594 A | 6/2007 | | |
| CN | 100565873 C | 12/2009 | | |
| JP | 2008533716 | * | 8/2008 | ............ H01L 33/00 |
| KR | 20060104160 A | 10/2006 | | |
| KR | 20070006073 A | 1/2007 | | |
| TW | I297220 B | 5/2008 | | |
| TW | I384637 B | 2/2013 | | |
| WO | WO-2006137711 A1 | * | 12/2006 | .......... H01L 27/153 |
| WO | 2010088823 A1 | 8/2010 | | |

* cited by examiner

LIGHT-EMITTING DEVICE

CROSS-REFERENCE TO RELATED APPLICATION

The present application is a continuation application of U.S. patent application Ser. No. 13/148,544, filed on Nov. 14, 2011, which is a national stage application of PCT Application No. PCT/CN2009/074422, filed on Oct. 13, 2009, and claims priority to Chinese Application No. 200910007059.2, filed on Feb. 9, 2009, the entire contents of which are herein incorporated by reference.

TECHNICAL FIELD

The application relates to a light-emitting device, and more particularly to a light-emitting device having at least one electronic element and at least one light-emitting diode array chip, which are arranged on a submount, and can be directly used with an alternative current source.

DESCRIPTION OF BACKGROUND ART

Light-emitting diode (LEDs) can emit light energy in the presence of energy difference resulted from movement of electrons between the n-type semiconductor and the p-type semiconductor. With this mechanism, the LEDs can generate cool light in contrary to incandescent bulbs. Besides, the LEDs are durable and compact, and have long lifespan and low energy-consumption. Accordingly, the LEDs become promising candidates in the market to be the next-generation lighting products in place of the conventional lighting sources, and are already applied to various fields such as traffic lights, backlight modules, street lights, and medical equipment.

As shown in FIG. 1, a light-emitting diode element 100, which can be adapted to an alternative current power source, includes a submount 10, a light-emitting diode array chip 12 on the submount 10, and at least one bonding pad 14 electrically connected to the light-emitting diode array chip 12. The light-emitting diode array chip 12 includes a substrate 120 and several light-emitting diode units 122 on the substrate 120.

To replace a conventional lighting device, the light-emitting diode element 100 must work on a high voltage condition of 100V~240V, which may bring about a high temperature issue after long time operation. Under the high voltage and high temperature conditions, an electronmigration effect, which is a result of movement of metal ions caused by a mixed effect of the temperature and the electron wind, can be easily found in an electronic device. Generally, the electronmigration of metal ions occurs easily at high temperature. In the light-emitting diode element, the metal ions may diffuse from the electrode to the active region by the effect of the electric current at high temperature. For example, the electronmigration may occur easily in the electrode material such as indium tin oxide (ITO) and silver. Moreover, the element may fail due to voids caused by the electronmigration in solder or tiny metal connection.

As described above, the reliability of the light-emitting diode element for alternative current usage can be seriously deteriorated at high temperature and high voltage environment.

SUMMARY OF THE DISCLOSURE

A light-emitting device in accordance with one embodiment of the present application includes a growth substrate, a plurality of light-emitting diode units formed on the growth substrate and arranged in a closed loop, an electrode directly formed on the growth substrate, an electrical connection structure formed on the growth substrate and connecting the plurality of light-emitting diode units with the electrode, and a plurality of rectifying diodes connecting to respective nodes of the closed loop.

DETAILED DESCRIPTION OF PREFERRED EMBODIMENTS

The embodiments are described hereinafter in accompany with FIGS. 2A-8.

Figure 1:
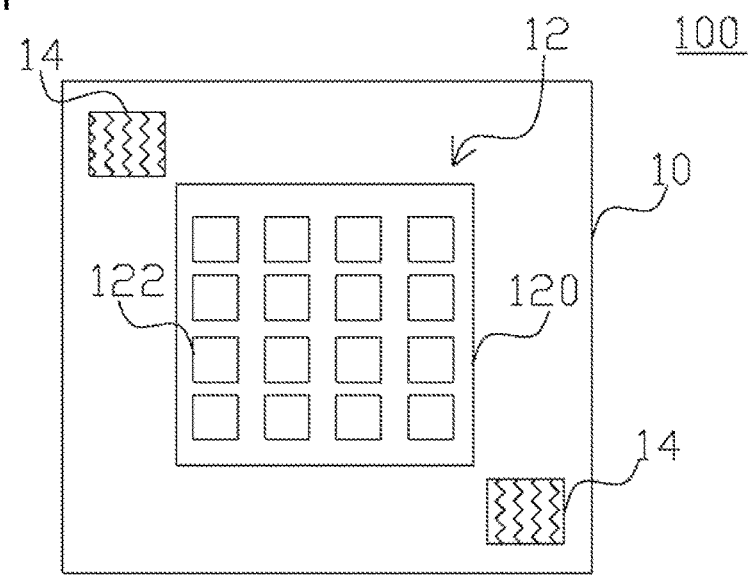
FIG. 1 illustrates a known light-emitting diode element used with an alternative current power source.
Figure 2A:
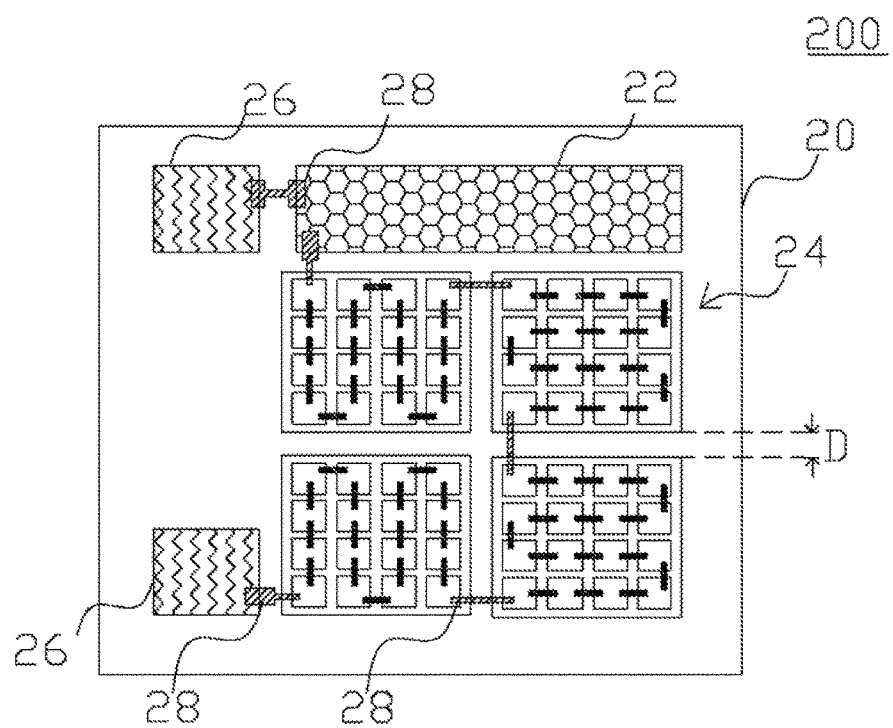
FIG. 2A is a top view of a structure in accordance with an embodiment of the present application.
Figure 2B:
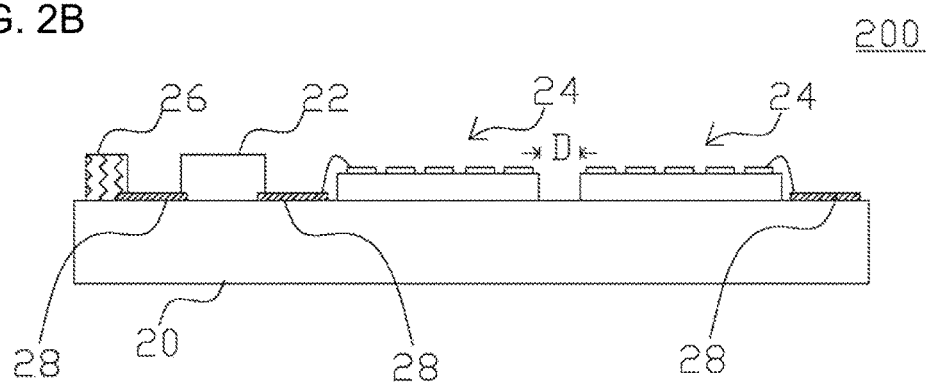
FIG. 2B is a side view of a structure in accordance with an embodiment of the present application.

As shown in FIGS. 2A and 2B, a light-emitting device 200 includes a submount 20, at least one electronic element 22 which is positioned on the submount 20, a plurality of light-emitting diode array chips 24 which are positioned on the submount 20, a bonding pad 26 which is positioned on the submount 20, and a conductive trace 28 which is positioned on the submount 20 and used to connect the electronic element 22 with the light-emitting diode array chip(s) 24 and the bonding pad 26 in series or parallel. Any two neighboring light-emitting diode array chips 24 are spaced apart by a gap D which can be greater than 10 μm, preferably greater than 100 μm. The bonding pad 26 is electrically connected to an alternative current (AC) power source/supply (not shown). The AC power source can provide a high voltage AC power, such as 100V to 240V for household appliance(s), to the light-emitting device 200.

The electronic element 22 can be one or more passive elements, such as rectifier(s), resistor(s), capacitor(s), and inductor(s).

Figure 2C:
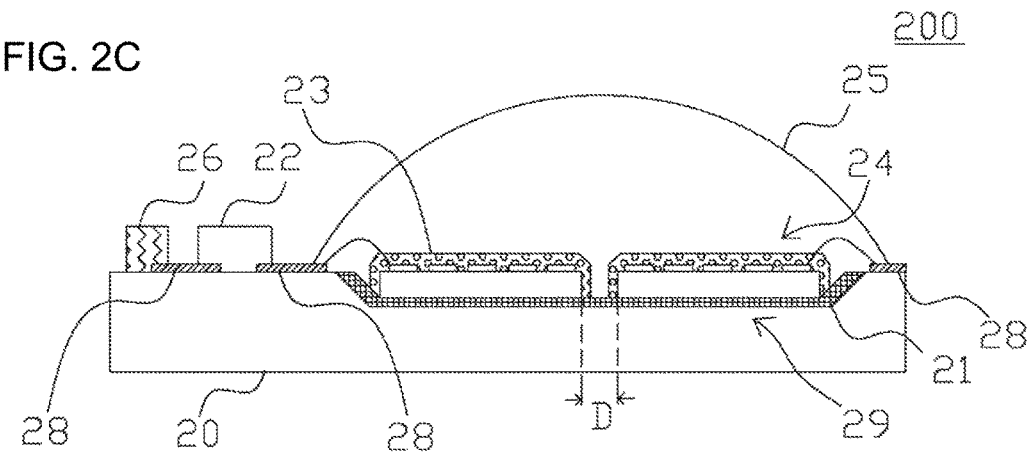
FIG. 2C is a side view of a structure in accordance with another embodiment of the present application.

As shown in FIG. 2C, the light-emitting device 200 further includes a reflecting layer 21 which is arranged on the submount 20 and used to reflect light emitted from the light-emitting diode array chip(s) 24. The submount 20 can have a recess structure 29 for accommodating the electronic element 22, or the light-emitting diode array chip(s) 24. In addition, the light-emitting device 200 further includes a wavelength converting layer 23 which is arranged on the light-emitting diode array chip 24, and an encapsulation material 25 which is overlaid on the light-emitting diode array chip(s) 24.

Figure 3:
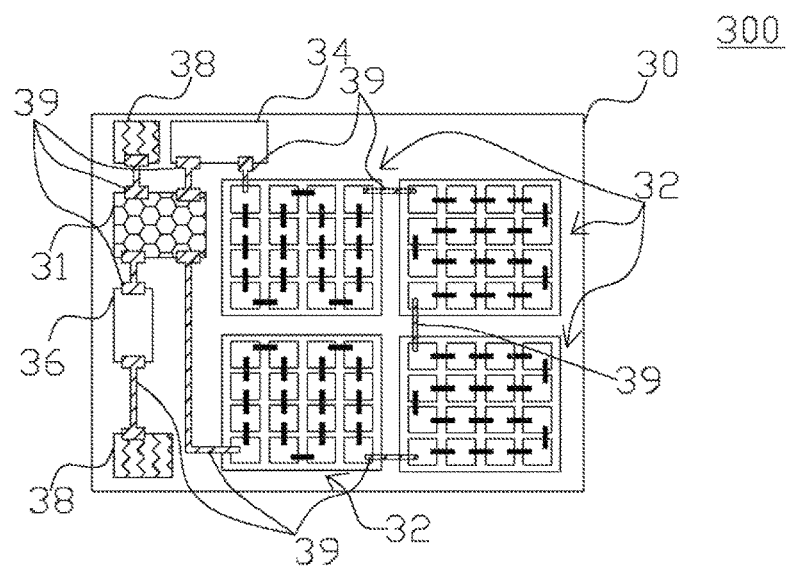
FIG. 3 is a top view of a structure in accordance with an embodiment of the present application.

As shown in FIG. 3, a light-emitting device 300 includes a submount 30, a rectifier 31 which is positioned on the submount 30, a plurality of light-emitting diode array chips 32 which are positioned on the submount 30, a resister 34 which is positioned on the submount 30 and connected to the light-emitting diode array chip(s) 32 in series, a capacitor 36 which is positioned on the submount 30 and connected to the light-emitting diode array chip(s) 32 and the resister 34 in series, a bonding pad 38 which is positioned on the submount 30, and a conductive trace 39 which is positioned on the submount 30 and used to electrically connect the rectifier 31 with the light-emitting diode array chip(s) 32, the capacitor 34, the resister 36, and the bonding pad 38. The rectifier 31 can include a bridge circuit which is an arrangement of diode(s) having low forward voltage and high reverse voltage. With the rectifier 31, a sine wave alternative current provided by the AC power source can be converted to a pulse direct current (DC) for use in the light-emitting device 300. The diode which has low forward voltage and high reverse voltage, can be a Zener diode or a Schottky diode, and made of material(s) of III-V compound or IV element, such as GaN series material, AlGaInP series material, and silicon. In addition, any two neighboring light-emitting diode array chips 32 are spaced apart by a gap greater than 10 µm, preferably greater than 100 µm. The bonding pad 38 is electrically connected to an alternative current (AC) power source/supply (not shown). The AC power source can provide a high voltage AC power, such as 100V to 240V for household appliance(s), to the light-emitting device 300.

Figure 4:
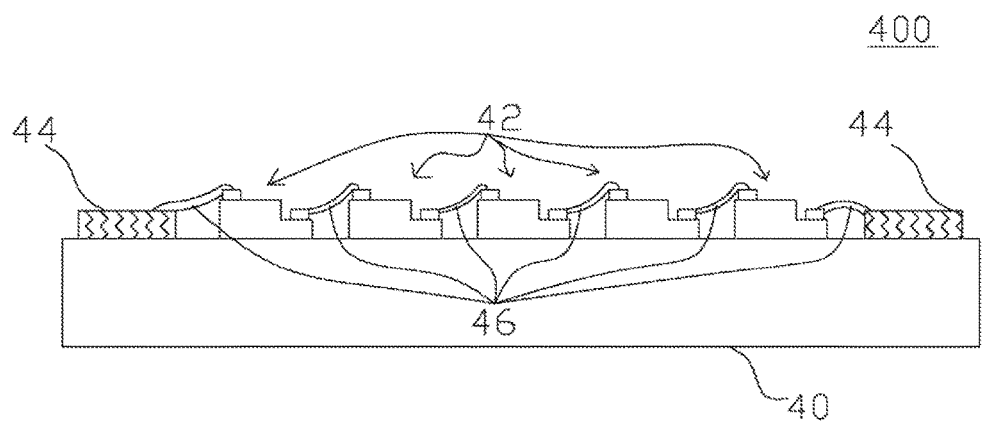
FIG. 4 is a side view of a light-emitting diode array chip in accordance with an embodiment of the present application.

As shown in FIG. 4, the light-emitting diode array chip 400 includes a substrate 40, a plurality of light-emitting diode units 42 which are arranged on the substrate 40, at least two electrodes 44 arranged on the substrate 40, and electrical-connection structures 46 which electrically connect the light-emitting diode units 42 with the electrodes 44 in series or parallel. The electrical-connection structure 46 can include metal wire(s), or metal layer(s). The electrodes 44 are used to electrically connect to the conductive trace(s) disclosed in the aforementioned embodiment(s) (not shown). Moreover, the light-emitting diode array chip 400 can have several working voltages by changing the numbers and the connection of the light-emitting diode units 42. With the flexible voltage design of each light-emitting diode array chip 400 and the series connection of several light-emitting diode array chips 400, the light-emitting device of the present embodiment can meet the voltage condition(s) for general household appliance(s), such as 100V to 240V.

Referring to FIGS. 2-4, an alternative current power system of 110 volts, which can be adapted to a general lighting system, is illustrated. The light-emitting diode array chips are arranged in a 2×2 matrix (as shown in FIG. 3). At least one of the light-emitting diode chips 32 includes a light-emitting layer of InGaN, which can emit a blue light with a peak wavelength ranged between 440 nm-480 nm (hereinafter defined as "blue light-emitting diode array chip"). In addition, at least one of the light-emitting diode array chips 32 includes a light-emitting layer of AlGaInP, which can emit a red light with a peak wavelength ranged between 600 nm-650 nm (hereinafter defined as "red light-emitting diode array chip"). A wavelength converting layer, which can absorb a blue light from the blue light-emitting diode array chip and generate a yellow light with a peak wavelength ranged between 570 nm-595 nm, is overlaid on the blue light-emitting diode array chip (hereinafter defined as "yellow phosphor"), such as YAG phosphor or TAG phosphor, as shown in FIG. 2C. The blue light and the yellow light can be mixed into a white light. To generate various color temperatures, an adjustment can be made to change numbers of the blue light-emitting diode array chip(s) and/or the red light-emitting diode array chip(s), areas of the blue light-emitting diode array chip(s) and/or the red light-emitting diode array chip(s), numbers of the light-emitting diode units in the blue light-emitting diode array chip(s) and/or the red light-emitting diode array chip(s). Or a phosphor, which can generate another color light, can be used, such as green phosphor. The embodiments are listed in following table; moreover, the second embodiment is described in detail below.

| embodiment | AC power system | Numbers of blue light-emitting diode array chip(s) | Numbers of blue light-emitting diode unit(s) | Numbers of red light-emitting diode array chip(s) | Numbers of red light-emitting diode unit(s) |
| --- | --- | --- | --- | --- | --- |
| 1 | AC 110 V | 2 | 12 | 2 | 6 |
| 2 | AC 110 V | 3 | 8 | 1 | 12 |
| 3 | AC 220 V | 2 | 24 | 2 | 12 |
| 4 | AC 220 V | 3 | 16 | 1 | 24 |

In the second embodiment listed in the table, the light-emitting device emits a warm white light. The power ratio of all blue light-emitting diode array chip(s) to all red light-emitting diode array chip(s) is about 3:1. For example, there are three blue light-emitting diode array chips and one red light-emitting diode array chip. Each blue light-emitting diode array chip has eight light-emitting diode units (hereinafter defined as "blue light-emitting diode units") which are connected in series. The red light-emitting diode array chip has twelve light-emitting diode units (hereinafter defined as "red light-emitting diode units") which are connected in series. Therefore, in one light-emitting device, the quantity ratio of all blue light-emitting diode units to all red light-emitting diode units is 24:12 (2:1). Provided one blue light-emitting diode unit has a forward voltage of about 3V and one red light-emitting diode unit has a forward voltage of about 2V, each of the blue and red light-emitting diode array chips can work on 24V, which can be called as a high voltage direct current (DC) array chip. Consequently, the light-emitting diode array chips of the 2×2 matrix can work on 96V. When the light-emitting device is driven to emit the blue light and the red light, the power ratio of the blue light to the red light is about 3:1. Provided the light-emitting diode array matrix is serially connected to a predetermined resister and the aforementioned rectifier having a bridge circuit, the light-emitting device can be used in an AC power system of 110V. In the present embodiment, the power ratio of all blue light-emitting diode array chip(s) to all red light-emitting diode array chip(s) is about 2~4, preferably 2.6~3.4. Alternatively, the quantity ratio of all blue light-emitting diode unit(s) to all red light-emitting diode unit(s) is about 4/3~8/3, which can generate a warm white light whose color temperature is between 2000K and 5000K, preferably between 2000K and 3500K. In another embodiment, the red light-emitting diode array chip can be replaced by several non-array-type red light-emitting diode chips which are connected with each other in series. The quantity of the non-array-type red light-emitting diode chips is equal to the quantity of all red light-emitting diode units in the replaced red light-emitting diode array chip. In specific, the non-array-type red light-emitting diode chip has only one red light-emitting diode unit whose forward voltage is about 2V.

Figure 5A:
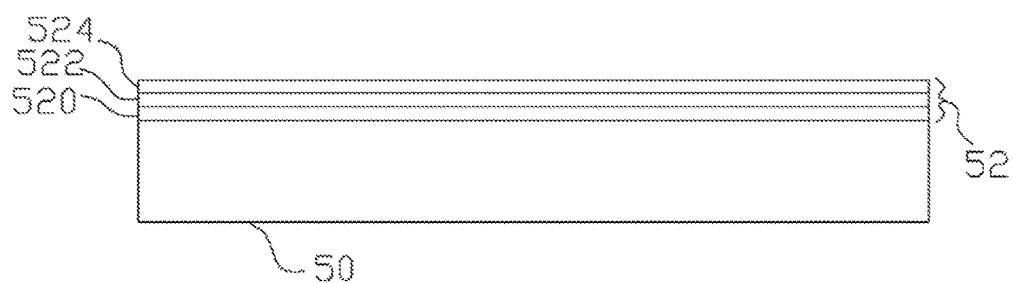
FIGS. 5A-5D illustrate processes of making a light-emitting diode array chip in accordance with an embodiment of the present application.

As shown in FIG. 5A, a substrate 50 is provided. An epitaxial stacked layer 52 is then formed on the substrate 50 by metal-organic chemical vapor deposition (MOCVD). The epitaxial stacked layer 52 includes a first conductivity type semiconductor layer 520, an active layer 522, and a second conductivity type semiconductor layer 524. The epitaxial stacked layer 52 can be made of semiconductor material(s) selected from Al, Ga, In, N, P, and As, such as GaN and AlGaInP.

Figure 5B:
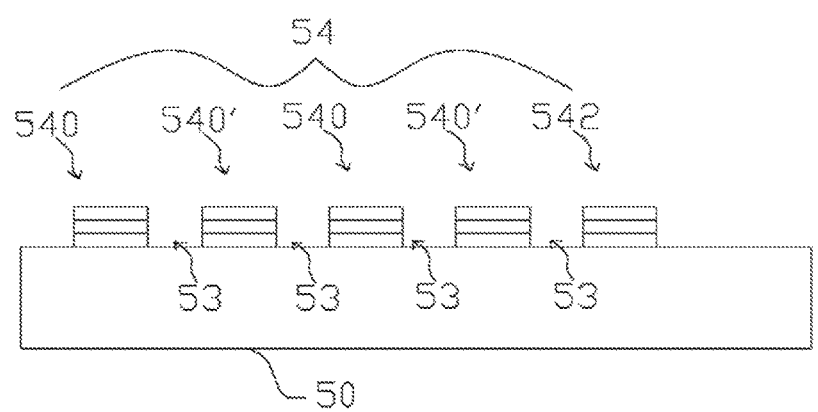

As shown in FIG. 5B, several trenches 53 are formed by etching the epitaxial stacked layer 52 with the lithography scheme, such that several diode units 54, which includes light-emitting diode units 540/540' and a rectifying diode unit 542, are formed on the substrate 50. The diode unit 54 can be epitaxially grown on the substrate 50. Alternatively, the diode unit 54 can be boned to another substrate by bonding layer(s) or pressure/thermal bonding, such that the substrate 50 is removed and replaced by another substrate (Hereinafter, the scheme is called "double substrate transfer"). For example, the substrate 50 is replaced by another substrate having a higher thermal conductivity or a high transparency, such that the thermal dissipation or the light extraction efficiency of the light-emitting diode array chip can be improved. For the red light-emitting diode array chip or the non-array-type red light-emitting diode chip, in one embodiment, the red light-emitting diode unit can be bonded to a high conductive substrate or a transparent substrate by metal, oxide, or organic polymer.

Figure 5C:
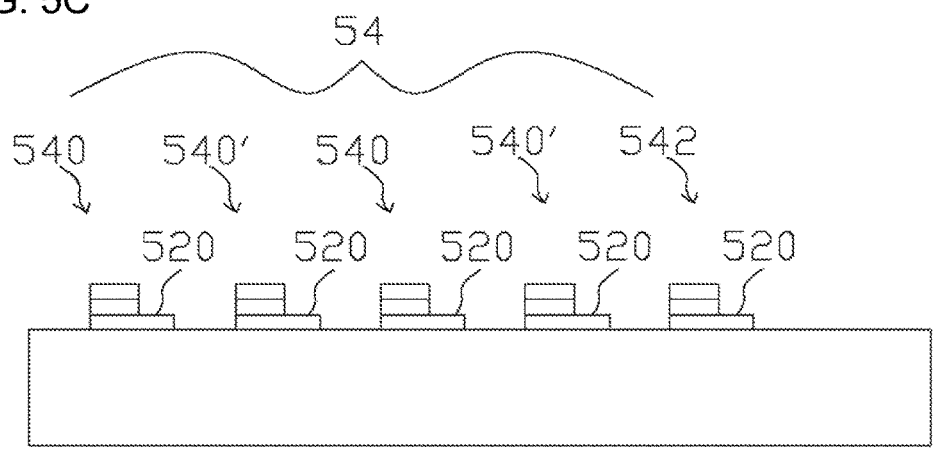

As shown in FIG. 5C, the diode units 54 are then etched with the lithography scheme to expose a part of the first conductivity type semiconductor layer 520.

Figure 5D:
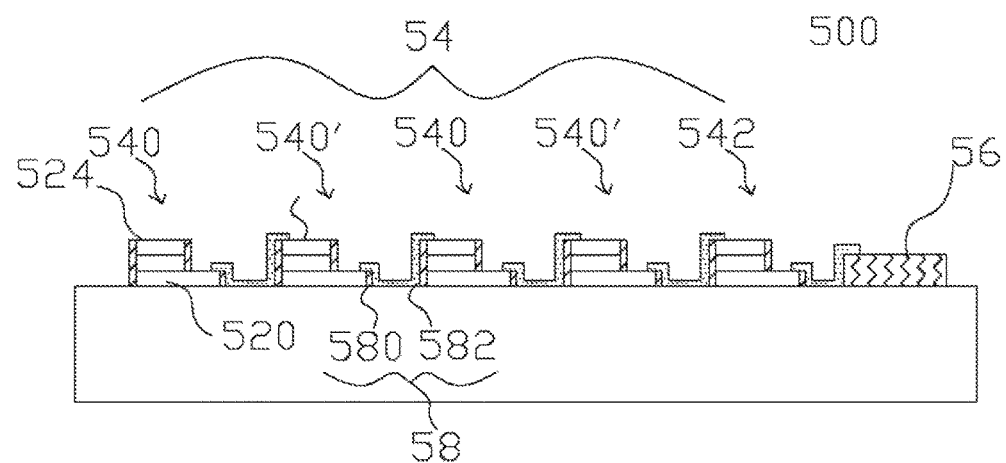

As shown in FIG. 5D, an electrode 56 is formed on the substrate to electrically connect to the conductive trace on the submount (not shown). In addition, several electrical connection structures 58 are formed to electrically connect the different diode units 54 and electrode 56. In the present embodiment, the electrical connection structure 58 includes an insulation layer 580 covering a sidewall of the diode unit 54, and a metal layer 582 arranged on the insulation layer 580.

Furthermore, the first conductivity type semiconductor layer 520 of the light-emitting diode unit 540 is electrically connected to the second conductivity type semiconductor layer 524 of the neighboring light-emitting diode unit 540'. With this arrangement, a series-connected closed loop can be formed, and consequently the light-emitting diode array chip 500 is formed.

Figure 6:
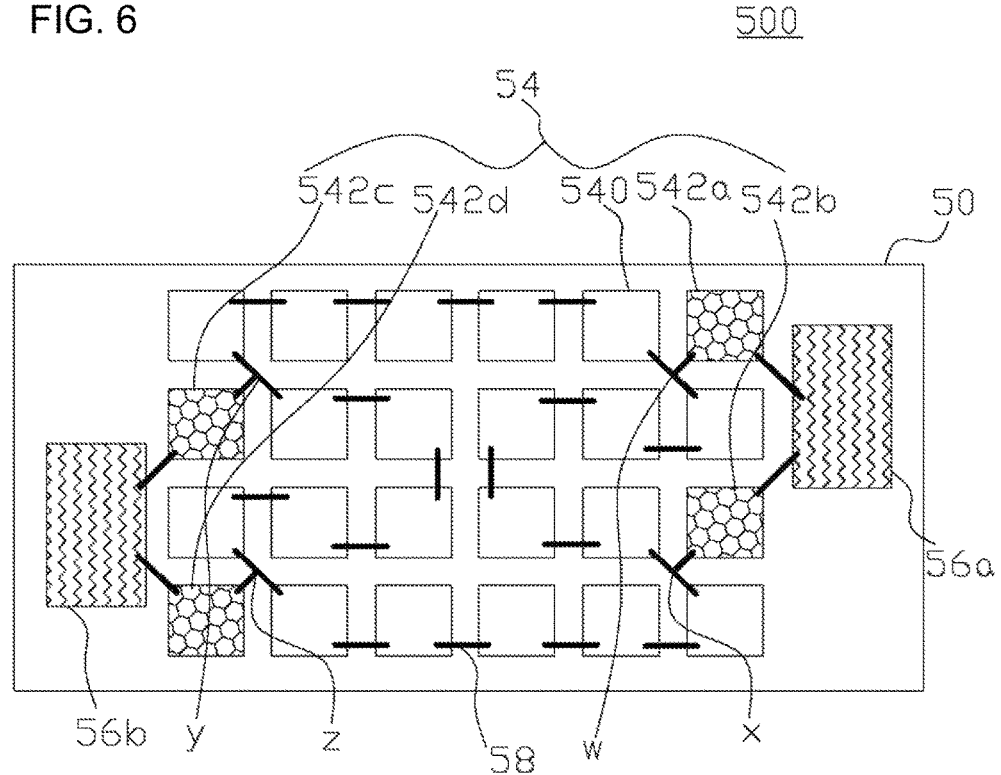
FIG. 6 is a top view of a light-emitting diode array chip in accordance with an embodiment of the present application.

As shown in FIG. 6, the light-emitting diode array chip 500 includes a substrate 50, diode units 54 arranged on the substrate 50, electrodes 56a, 56b arranged on the substrate 50, and electrical connection structures 58 for connecting the diode units 54 and the electrodes 56a, 56b in series, or parallel.

The diode units 54 include light-emitting diode units 540 and rectifying light-emitting diode units 542a, 542b, 542c, 542d. The electrode 56a is electrically connected to a first conductivity type semiconductor layer (not shown) of the rectifying light-emitting diode unit 542a and a second conductivity type semiconductor layer (not shown) of the rectifying light-emitting diode unit 542b by the electrical connection structures 58. The electrode 56b is electrically connected to a first conductivity type semiconductor layer (not shown) of the rectifying light-emitting diode unit 542c and a second conductivity type semiconductor layer (not shown) of the rectifying light-emitting diode unit 542d by the electrical connection structures 58. In addition, the light-emitting diode units 540 are arranged in a series-connected closed loop. To form a bridge circuit, the rectifying light-emitting diode units 542a, 542b, 542c, 542d are respectively connected to different nodes w, x, y, z in the series-connected closed loop.

Figure 7A:
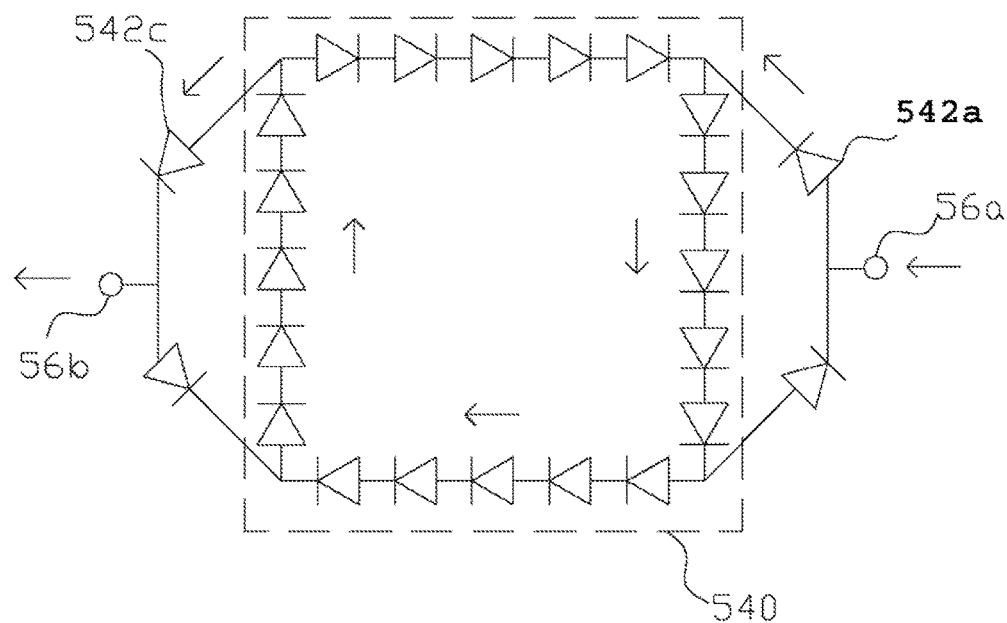
FIGS. 7A and 7B illustrate circuits of light-emitting diode array chips in accordance with embodiments of the present application.
Figure 7B:
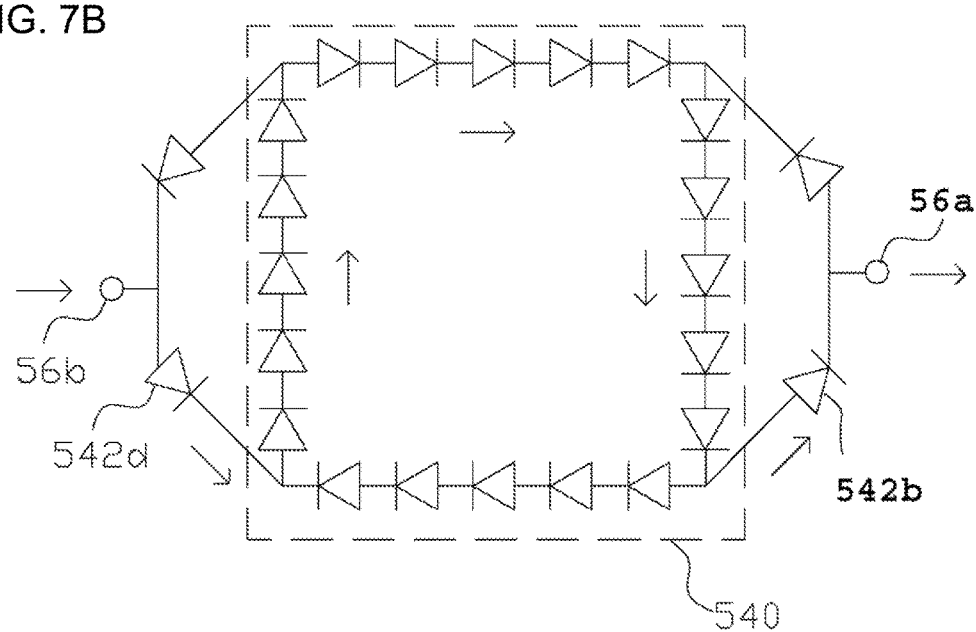

FIGS. 7A and 7B illustrate equivalent circuits of the aforementioned light-emitting diode array chips. The arrow indicates the current direction in the light-emitting diode array chip. As shown in FIG. 7A, the current, which is injected into the light-emitting diode array chip 500 via the electrode 56a, flows through the rectifying light-emitting diode unit 542a, some light-emitting diode units 540 in the closed loop (the path is indicated by the arrows), and the rectifying light-emitting diode unit 542c before leaving the light-emitting diode array chip 500 via the electrode 56b. In another case, as shown in FIG. 7B, the current, which is injected into the light-emitting diode array chip 500 via the electrode 56b, flows through the rectifying light-emitting diode unit 542d, some light-emitting diode units 540 in the closed loop (the path is indicated by the arrows), and the rectifying light-emitting diode unit 542b before leaving the light-emitting diode array chip 500 via the electrode 56a.

Figure 8:
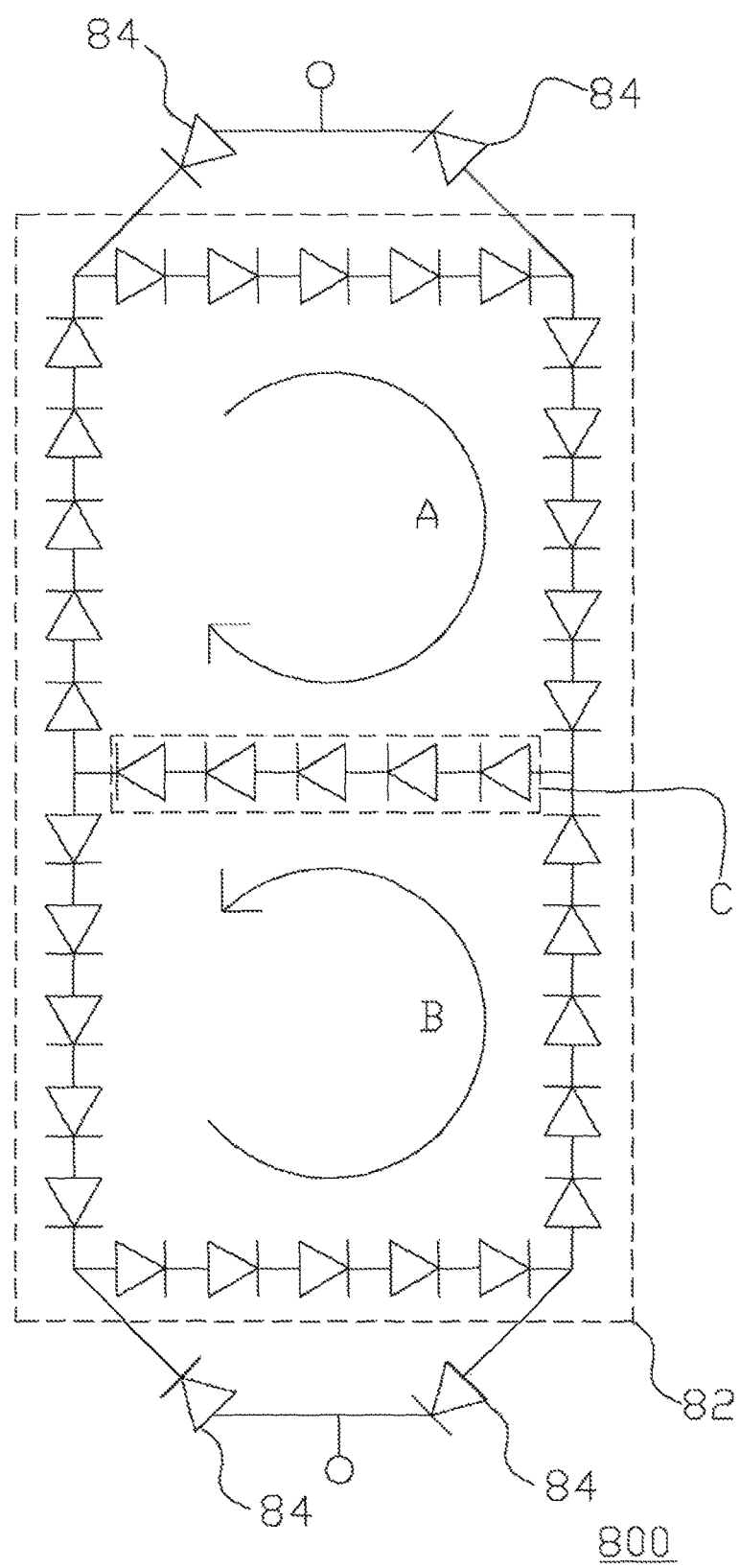
FIG. 8 illustrates another circuit of a light-emitting diode array chip in accordance with an embodiment of the present application.

As shown in FIG. 8, in the light-emitting diode array chip 800, several light-emitting diode units 82 are arranged to form series-connected closed loops A, B and a common circuit C. The closed loops adjoining with each other have different connection directions. In the present embodiment, the closed loop A is connected in clockwise direction; the closed loop B is connected in counterclockwise direction. Moreover, there is at least one common circuit C between the adjoining closed loops A and B. In addition, the light-emitting diode array chip 800 includes several rectifying diode units 84 which are respectively connected to four nodes in the closed loops A and B to form a bridge circuit which can provide a rectifying function.

Although the invention is explained above, it is not limited the range, the sequence in practice, the material in practice, or the method in practice is. Any modification or decoration for this invention is not away from the spirit and the range of this invention.

We claim:
1. A light-emitting device comprising:
   a first light-emitting diode chip comprising:
     a substrate;

a plurality of light-emitting diode units epitaxially connected to the substrate, having a sidewall, and arranged in a closed loop;

an electrode formed on the substrate;

an insulating layer having a shape substantially conforming to the sidewall;

a metal layer formed on the insulating layer, and electrically connecting the plurality of light-emitting diode units and the electrode;

a plurality of rectifying diodes epitaxially connected to the substrate and connected to respective nodes of the closed loop; and an electrical connection structure formed on a predetermined one of the plurality of rectifying diodes and comprising a first portion and a second portion separated from the first portion, wherein the first portion and the second portion are located on two corners which are located on a diagonal line of the predetermined one of the plurality of rectifying diodes, wherein the plurality of light-emitting diode units comprises at least two light-emitting diode units, the at least two light-emitting diode units are configured to alternately emit light when the light-emitting device is operated, and wherein each of the plurality of light-emitting diode units is formed in a rectangular shape.

2. The light-emitting device of claim 1, wherein the plurality of light-emitting diode units and the plurality of rectifying diodes have a same epitaxial stacked layer.

3. The light-emitting device of claim 1, wherein the plurality of rectifying diodes is physically separated by the plurality of light-emitting diode units.

4. The light-emitting device of claim 1, wherein the plurality of light-emitting diode units has more than three light-emitting diode units physically arranged in a line.

5. The light-emitting device of claim 1, further comprising a submount on which the first light-emitting diode chip is arranged.

6. The light-emitting device of claim 5, further comprising a second light-emitting diode chip formed on the submount and having a peak wavelength different from the first light-emitting diode chip.

7. The light-emitting device of claim 5, further comprising an electronic element formed on the submount and including a resistor, a capacitor, or an inductor.

8. The light-emitting device of claim 1, further comprising an encapsulation material covering the first light-emitting diode chip.

9. The light-emitting device of claim 1, further comprising a wavelength converting layer arranged on the first light-emitting diode chip.

10. The light-emitting device of claim 1, wherein the plurality of light-emitting diode units is connected in series.

* * * * *